(12) United States Patent
Brink et al.

(10) Patent No.: US 7,503,024 B1
(45) Date of Patent: Mar. 10, 2009

(54) METHOD FOR HIERARCHICAL VLSI MASK LAYOUT DATA INTERROGATION

(75) Inventors: Richard Scott Brink, Rochester, MN (US); Michael Robert Curry, Rochester, MN (US); Raymond Alan Richetta, Rochester, MN (US); Timothy Joseph Schmerbeck, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/169,447

(22) Filed: Jul. 8, 2008

(51) Int. Cl.
*G06F 17/50* (2006.01)

(52) U.S. Cl. .................. 716/5; 716/11; 716/19

(58) Field of Classification Search .................. 716/5, 716/11, 18, 19
See application file for complete search history.

(56) References Cited

U.S. PATENT DOCUMENTS

| 5,761,664 | A | * | 6/1998 | Sayah et al. ............. 707/100 |
| 6,256,768 | B1 | | 7/2001 | Igusa |
| 6,397,372 | B1 | | 5/2002 | Bozkus et al. |
| 7,124,380 | B2 | | 10/2006 | Keller et al. |

* cited by examiner

*Primary Examiner*—Sun J Lin
(74) *Attorney, Agent, or Firm*—Robert R. Williams; Suiter Swantz pc llo

(57) ABSTRACT

The present disclosure is directed to a method for hierarchical Very Large Scale Integrated (VLSI) mask layout data interrogation. The method displays a tree diagram of the layout hierarchy and then allows the user to interrogate the mask layout shapes by using a cross probing feature.

1 Claim, 2 Drawing Sheets

METHOD FOR HIERARCHICAL VLSI MASK LAYOUT DATA INTERROGATION

TECHNICAL FIELD

The present disclosure generally relates to the field of Very Large Scale Integrated (VLSI) circuit design, and more particularly to a method for hierarchical VLSI mask layout data interrogation.

BACKGROUND

With the number of transistors in modern Very Large Scale Integrated (VLSI) circuit designs continuing to increase, the task of finding problems within the mask layout shapes can be difficult. One such problem that often occurs is when a design is run through a Layout vs. Schematic (LVS) tool that requires certain intermediate mask levels to be in the same level of hierarchy. Due to hierarchical interactions, such intermediate mask levels that are the result of Boolean operations within the runset may end up at a level different in the hierarchy than one of the original mask levels, and subsequent Boolean operations on these levels may fail due to this change in hierarchy. Finding such shapes or polygons in a mask layout tool can often be difficult due to the shear size of the layout, the number of levels of hierarchy, and the number of intermediate mask levels produced by the tool runset.

The current method of debugging such problems involves opening up the mask layout, querying individual shapes, reading the hierarchical description that the shapes reside in using a status window, and comparing the text of various shapes. Such a query may result in a description such as this:

> "Rectangle on CA at (16.936,158.414) nested on internal view "lib_A cell_A layout". Placement: [mir=false, rot=0,x=17.328,y=25.289] Hierarchy: view(lib_A cell_A layout) trans/view(lib_A cell_B layout) trans/view(lib_A cell_C layout) trans/view(lib_A cell_D layout) trans/view(lib_A cell_E layout) trans/view(lib_B cell_F layout) comp(I2)/view(lib_B cell_G layout) comp(I18)/view(lib_B cell_H layout) comp(I1)/view(lib_B cell_I layout) comp(I1)/view(lib_B cell_J layout) trans/view(lib_B cell_K layout) trans/view(lib_B cell_L layout)"

An alternate method involves turning on only certain levels of hierarchy at a time, then flipping between the hierarchical levels to make comparisons. However, both of these methods are time consuming, error prone, and cumbersome.

SUMMARY

The present disclosure is directed to a method for hierarchical VLSI mask layout data interrogation. The method may display a tree diagram of the layout hierarchy and then may allow the user to interrogate the mask layout shapes by using a cross probing feature.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

The present disclosure is directed to a method for hierarchical VLSI mask layout data interrogation. The method may display a tree diagram of the layout hierarchy and then may allow the user to interrogate the mask layout shapes by using a cross probing feature.

Figure 1A:
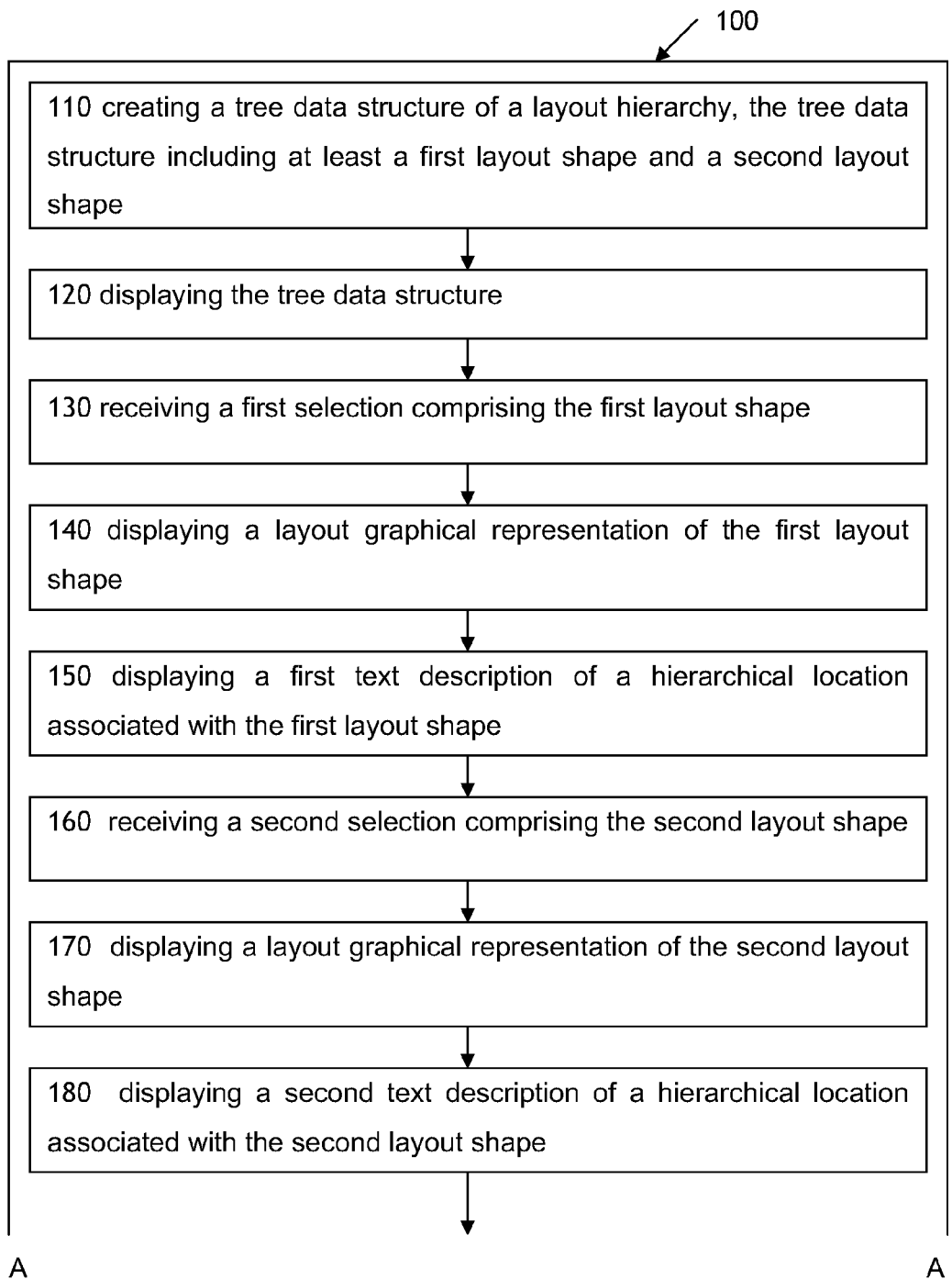
FIG. 1A is a flow diagram of the method for hierarchical VLSI mask layout data interrogation.
Figure 1B:
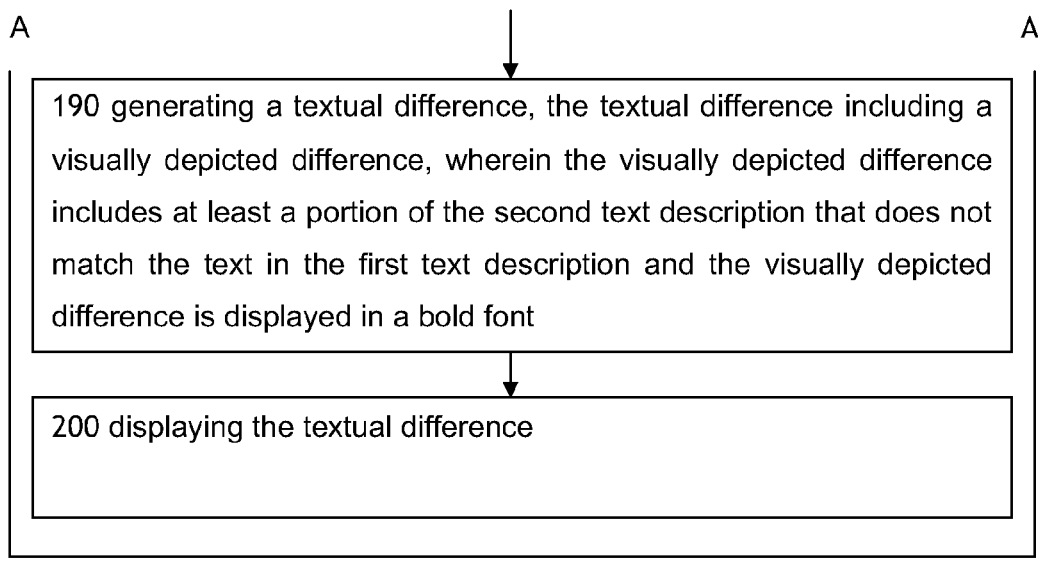
FIG. 1B is a flow diagram of the method for hierarchical VLSI mask layout data interrogation.

Referring to FIG. 1, a flow diagram of a method 100 for hierarchical VLSI mask layout data interrogation is depicted. Method 100 includes creating a tree data structure of a layout hierarchy, the tree data structure including at least a first layout shape and a second layout shape 110. The method 100 then displays the tree data structure 120. Upon displaying the tree data structure 120, the method 100 receives a first selection comprising the first layout shape 130. Then, the method 100 displays a layout graphical representation through the highlighting of the tree data structure of the first layout shape 140. Next, the method 100 displays a first text description of a hierarchical location associated with the first layout shape 150. The method 100 then receives a second selection comprising the second layout shape 160. The method 100 displays a layout graphical representation through the highlighting of the tree data structure of the second layout shape 170. Next, the method 100 displays a second text description of a hierarchical location associated with the second layout shape 180. Next, the method generates a textual difference, the textual difference including a visually depicted difference, wherein the visually depicted difference includes at least a portion of the second text description that does not match the text in the first text description and the visually depicted difference is displayed in a highlighted manner, the highlighted manner may consist of a bold font, an italics font, or the like 190. Finally, the textual difference is displayed 200.

Placing the mask layout browser tool in a mode where rolling over or clicking on individual shapes and/or polygons may result in a highlighting of the tree diagram of the specific block of hierarchy that the shape and/or polygon resides in. Such a method may provide a more efficient and less error prone method for the operator to view and interrogate hierarchical interactions of mask layout shapes and/or polygons.

Upon the selection of the first and second layout shapes, the following text may be a representation of the textual difference that may be displayed to the user:

> Rectangle on CA at (16.936,158.414) nested on internal view "lib_A cell_A layout". Placement: [mir=false, rot=0,x=17.328,y=25.289] Hierarchy: view(lib_A cell_A layout) trans/view(lib_A cell_B layout) trans/view(lib_A cell_C layout) trans/view(lib_A cell_D layout) trans/view(lib_A cell_E layout) trans/view(lib_B cell_F layout) comp(I2)/view(lib_B cell_G layout) comp(I18)/view(lib_B cell_I layout) comp(I1)/view (lib_B cell_K layout) comp(I1)/view(lib_B cell_L layout) trans/view(lib_B cell_M layout) trans/view(lib_B cell_N layout)

Rectangle on CA at (17.324,158.414) nested on internal view "lib_A cell_A layout". Placement: [mir=false, rot=0,x=17.328,y=25.289] Hierarchy: view(lib_A cell_A layout) trans/view(lib_A cell_B layout) trans/view(lib_A cell_C layout) trans/view(lib_A cell_D layout) trans/view(lib_A cell_E layout) trans/view(lib_B cell_F layout) comp(I2)/view(lib_B cell_H layout) comp(I19)/view(lib_B cell_J layout) comp(I2)/view(lib_B cell_K layout) comp(I1)/view(lib_B cell_L layout) trans/view(lib_B cell_M layout) trans/view(lib_B cell_N layout)

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for hierarchical VLSI mask layout data interrogation, comprising:
   creating a tree data structure of a layout hierarchy, the tree data structure including at least a first layout shape and a second layout shape;
   displaying the tree data structure;
   receiving a first selection comprising the first layout shape;
   displaying a layout graphical representation through the tree data structure of the first layout shape;
   displaying a first text description of a hierarchical location associated with the first layout shape;
   receiving a second selection comprising the second layout shape;
   displaying a layout graphical representation through the tree data structure of the second layout shape;
   displaying a second text description of a hierarchical location associated with the second layout shape;
   generating a textual difference, the textual difference including a visually depicted difference, wherein the visually depicted difference includes at least a portion of the second text description that does not match the text in the first text description; and
   displaying the textual difference.

* * * * *